United States Patent [19]

Cutchaw

[11] 4,166,665
[45] Sep. 4, 1979

[54] LIQUID COOLED CONNECTOR FOR LARGE SCALE INTEGRATED CIRCUIT PACKAGES

[76] Inventor: John M. Cutchaw, 7333 E. Virginia, Scottsdale, Ariz. 85257

[21] Appl. No.: 913,871

[22] Filed: Jun. 8, 1978

Related U.S. Application Data

[63] Continuation-in-part of Ser. No. 862,582, Dec. 20, 1977, which is a continuation-in-part of Ser. No. 754,365, Dec. 27, 1976, Pat. No. 4,063,791.

[51] Int. Cl.² .............................................. H01R 13/00
[52] U.S. Cl. ............................ 339/112 L; 339/17 CF; 339/75 MP
[58] Field of Search ......... 339/112 L, 17 CF, 75 MP, 339/75 M, 17 R, 17 LM, 17 M, 88 R, 88 C, 89 R, 89 C, 89 M, 127 R, 127 C; 220/297

[56] References Cited

U.S. PATENT DOCUMENTS

| | | | |
|---|---|---|---|
| 3,757,271 | 9/1973 | Judge et al. | 339/75 MP X |
| 3,877,064 | 4/1975 | Scheingold et al. | 339/17 CF X |
| 3,904,262 | 9/1975 | Cutchaw | 339/75 MP X |

OTHER PUBLICATIONS

IBM Technical Disclosure Bulletin, Bhattacharye et al., vol. 21, No. 2, Jul. 1978, p. 613.

Primary Examiner—Roy Lake
Assistant Examiner—DeWalden W. Jones
Attorney, Agent, or Firm—Herbert E. Haynes, Jr.

[57] ABSTRACT

A connector for demountably attaching a large scale integrated circuit package to a backpanel includes a base receptacle mounted on the backpanel with contact means therein which are in contact with the backpanel. In the preferred embodiment, the base receptacle is adapted to receive a leadless circuit package therein with the terminals of the package in alignment with the contact means of the base receptacle, and the base receptacle is provided with upstanding headed studs. A cover having apertures formed therein is mounted atop the base receptacle so that lateral movement of the cover relative to the base causes interaction of the studs with the apertures to load the terminals of the circuit package into conductive contact with the contact means of the base receptacle and to demountably lock the cover in place atop the base. A fluid-tight chamber is provided between the cover and the integrated circuit package so that a coolant may be circulated therethrough for dissipating the heat produced during operation of the integrated circuit package.

22 Claims, 13 Drawing Figures

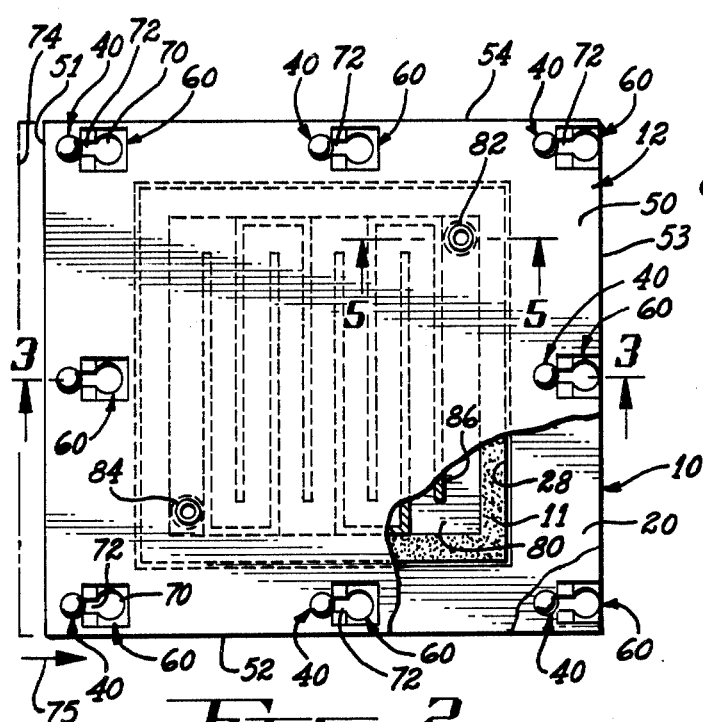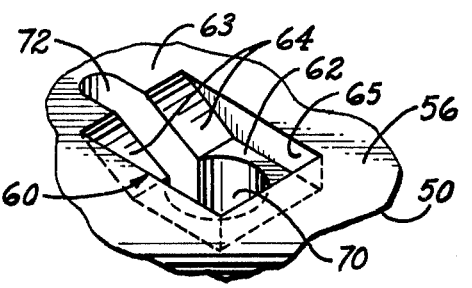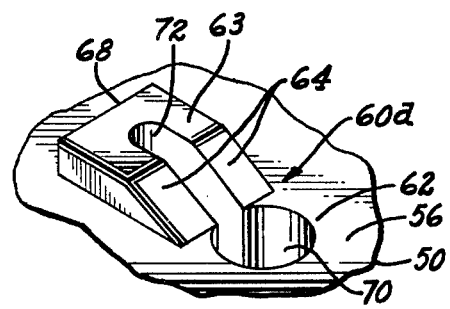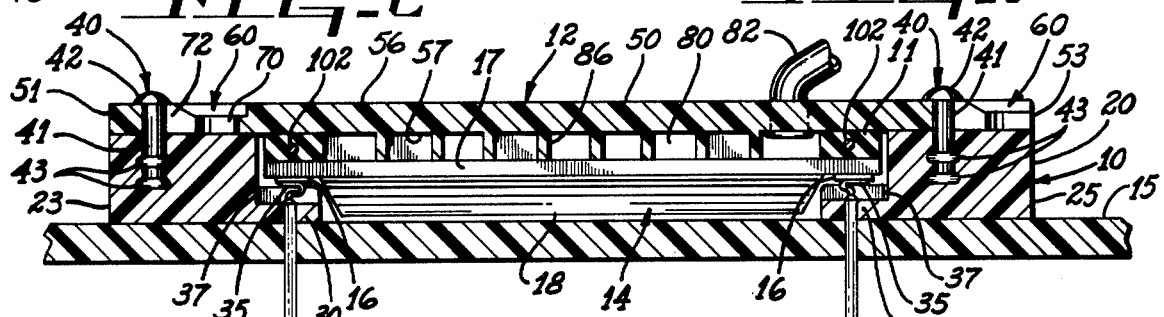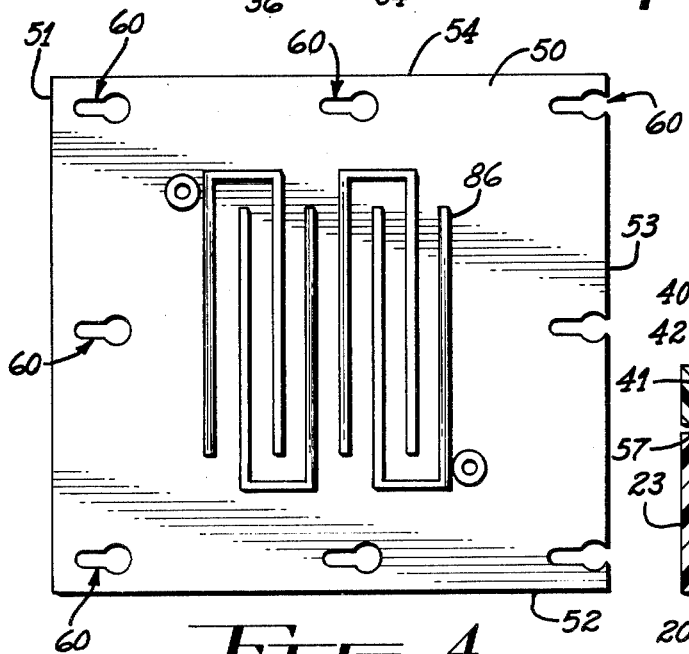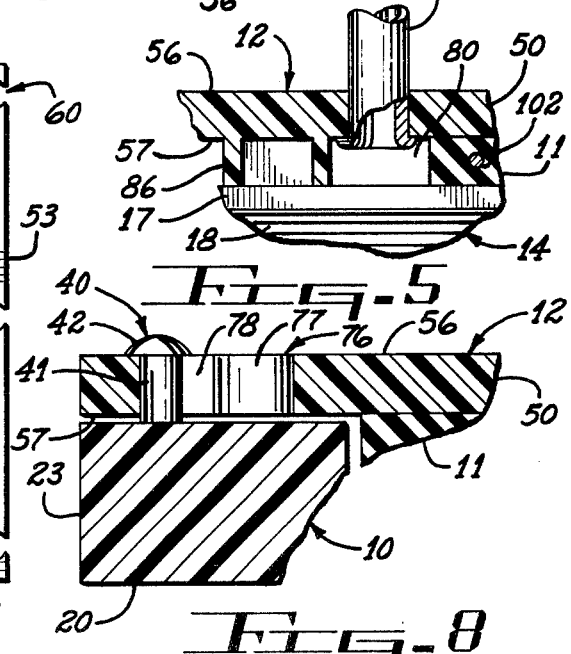

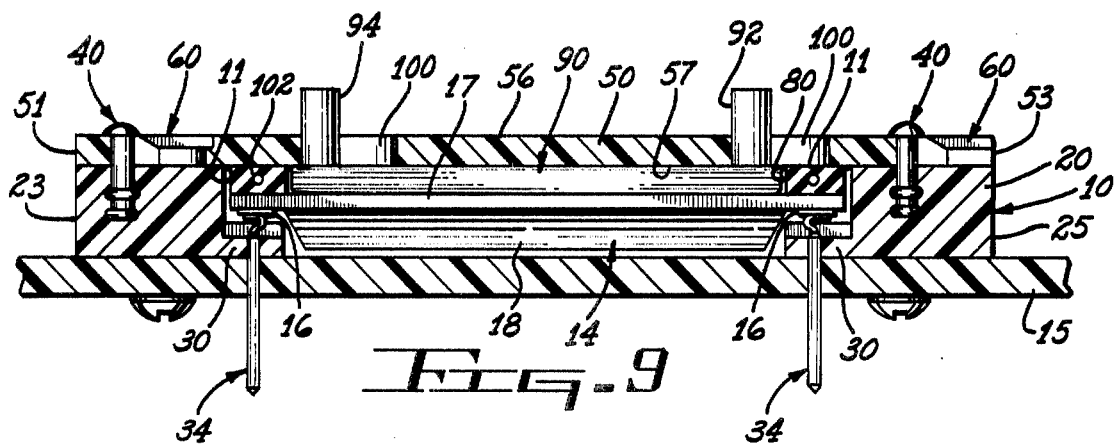
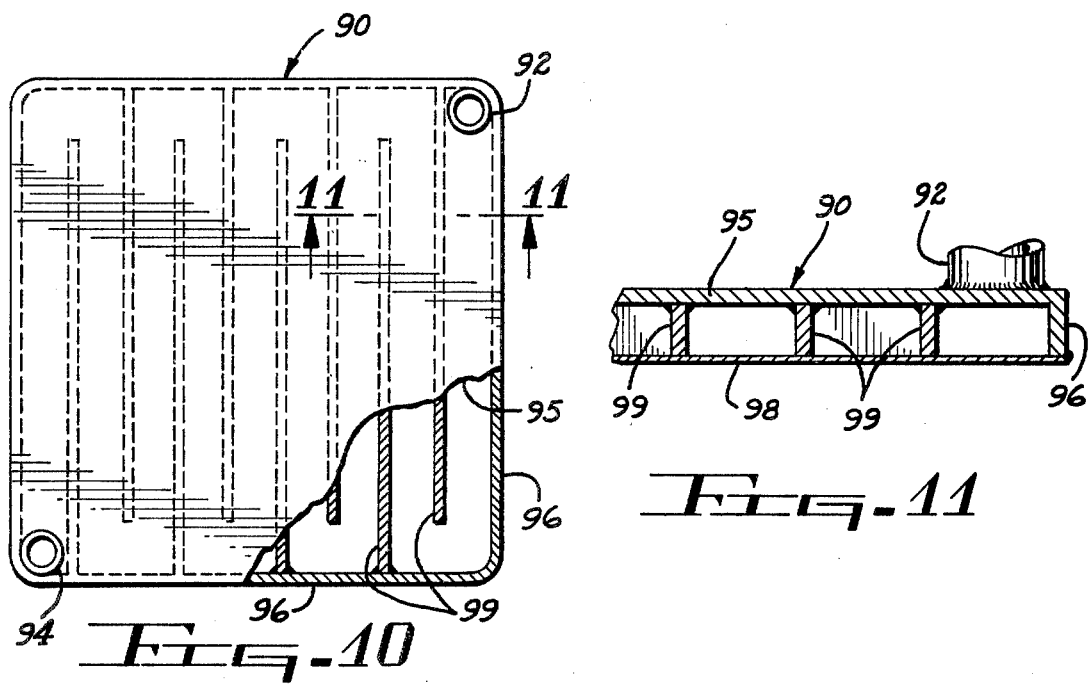
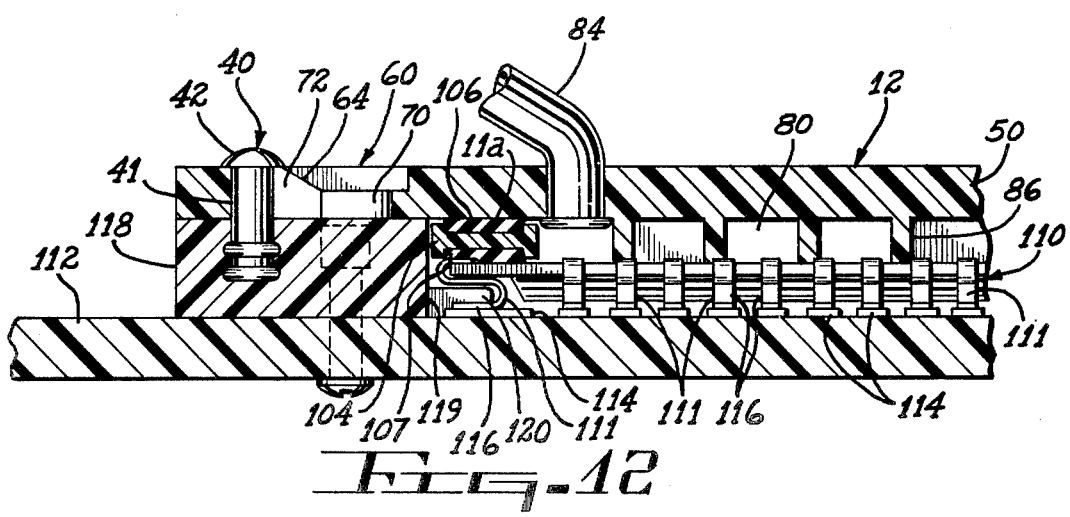

LIQUID COOLED CONNECTOR FOR LARGE SCALE INTEGRATED CIRCUIT PACKAGES

CROSS REFERENCE TO RELATED PATENT APPLICATION

This application is a continuation-in-part of copending U.S. patent application Ser. No. 862,582, filed Dec. 20, 1977 for, "Improved Connector For Leadless Integrated Circuit Packages", which in turn is a continuation-in-part of application Ser. No. 754,365, filed Dec. 27, 1976, now U.S. Pat. No. 4,063,791 issued Dec. 20, 1977, all by the same inventor.

BACKGROUND OF THE INVENTION

1. Field of the Invention

This invention relates to electrical connectors and more particularly to a liquid cooled connector for large scale integrated circuit packages.

2. Description of the Prior Art

The need for an improved integrated circuit packaging system has become critical, from a profit standpoint, with companies who are trying to use highly developed electronic technology in commercial and consumer applications such as automotive, appliances, communications, industrial components, industrial systems, computers, and the like.

The need stems from the inability of the otherwise excellent dual-in-line package (DIP) to physically meet manufacturing, testing, assembly, and servicing requirements that are being imposed thereon. This problem is due to the leads of the DIP not being strong enough for the manual and mechanical handling that they are receiving as they are being employed in a variety of new products.

This problem with the leads of integrated circuit packages, along with the desire to reduce costs, increase packaging densities, and the like, has led to the development of large scale integrated circuit packages both of the DIP type and what has become known as a 2×2 substrate, 3×3 substrate and the like. In most instances, in place of the leads, the large scale integrated circuit packages are leadless, in that terminal pads located adjacent the edges of a flat ceramic substrate, are employed rather than the usual leads, and these terminal pads are connected to discreet solid state circuits mounted on the substrate. The DIP leadless package is usually rectangular with the terminal pads located adjacent the opposite longitudinal edges. The 2×2 substrate, which will hereinafter be known to refer to all such structures, is square and is usually provided with terminal pads adjacent each of its peripheral edges. Specific positioning of the terminal pads is accomplished in three ways which are referred to as: face mount, side mount, and edge mount. The face mount technique places the terminal pads on one face, or planar surface, of the substrate with the pads disposed adjacent at least two edges. The side mount technique locates the terminal pads on two opposite edges of the substrate so that the pads are disposed in planes which are perpendicular to the planar surfaces of the substrate. The edge mount technique is similar to the commonly employed method used in printed circuit boards in that the pads are located on both planar surfaces of the substrate and are located adjacent the same one edge thereof.

Commercial acceptance of these leadless packages has been relatively slow due to various problems such as connectors for mounting and electrically interconnecting the packages with a backpanel such as a printed circuit board or a wiring panel.

Various connector configurations have been employed or suggested for the various leadless connectors, with these prior art connectors being relatively bulky and multi-part complex structures. Since the use of terminal pads dictates that a pressure type of interconnection be employed, the forces needed to achieve reliable connections becomes quite large and can be a serious problem when relatively large numbers of interconnections are to be made.

One particular prior art connector employs a base which is mounted on the backpanel by soldering or otherwise attaching the wire wrap pins, which depend from the base, into the backpanel. The leadless package is mounted within a recess provided in the base and the terminal pads of the package are pressurized into conductive contact with upwardly extending portions of the wire wrap pins. The necessary downward pressure is accomplished by means of a cover hingedly mounted on the base. This, and similar prior art connectors, are usually employed only on relatively small leadless packages of the type having terminal pads on only two edges thereof due to the inability of such covers to achieve equal pressurization over long spans and on packages having terminal pads on more than two edges.

Another type of prior art connector employs a base, similar to the one described above, for receiving the leadless package. A force exerting element is placed on the leadless package and is pressurized downwardly by means of a cover which is screwed in place. The screws are located only at the corners or ends of such connectors, as determined by the geometric configuration, so as not to sacrifice valuable contact space. Such a mounting technique complicates servicing and when relatively large leadless packages are mounted in this type of connector, uneven contact pressurization can result in the spans between the mounting screws due to deflection or bowing of the cover and the force exerting element.

A particular prior art connector, which is fully disclosed in U.S. Pat. No. 3,904,262, issued on Sept. 9, 1975, to the same inventor, includes a base receptacle mounted on a backpanel and having contact means therein which are in contact with the backpanel. The receptacle is adapted to receive the circuit package therein so that the terminal pads thereof are in alignment with the contact means provided in the receptacle. A cover is removably mounted in the receptacle and is laterally slidable relative thereto into and out of engagement with inclined plane members formed in the receptacle. When the cover is moved into engagement with the inclined plane members it will be deflected downwardly and locked in place to load the terminal pads of the circuit package into conductive contact with the contact means of the base receptacle. This connector, while constituting a substantial improvement in the art has some drawbacks, in that the wedging action provided by engagement of the cover with the inclined plane members is exerted only on three sides of the circuit package thus making it possible for unequal pressurization of the terminal pads on the fourth side of the circuit package to occur. Further, this prior art connector requires the usage of tooling to accomplish the required lateral sliding of the cover thereof.

Due to the increased packaging density, and other reasons relating to higher switching rates and the like, heat buildup in modern electronic equipment has become a serious problem, and cooling of large scale integrated circuits is of prime importance. Cooling by natural air convection has given way to forced air cooling in a variety of exotic metallic conduction systems. However, heat dissipation by such forced air systems is limited, and several liquid cooling systems have been developed. These prior art liquid cooling systems are, in general, rather cumbersome mechanisms which contribute significantly to the weight and cost of the electronic equipment.

In view of the foregoing, the need exists for a new and useful liquid cooled connector for large scale integrated circuit packages which overcomes some of the problems of the prior art.

SUMMARY OF THE INVENTION

In accordance with the present invention, a new and improved connector for integrated circuit packages is disclosed which may be configured to accommodate various sizes and shapes of such packages, and may also be configured to employ any of several types of electrical interconnecting techniques so as to be compatible with a variety of printed circuit boards or wiring panels currently in use, the connector of the present invention also includes an integral fluid-tight chamber through which a liquid coolant may be circulated for heat dissipation purposes.

The connector of the present invention includes a base receptacle for mounting on the backpanel to which the integrated circuits are to be electrically coupled. In the first embodiment, the base receptacle is formed with a chamber therein for receiving the large scale integrated circuit package so that the terminals thereof are in alignment with contact means provided in the chamber of the base. The contact means extend from the chamber of the base and are adapted to be coupled to the backpanel in any manner suited to the particular type of backpanel, and electrical interconnection between the terminals of the circuit package and the contact means of the connector is accomplished by exerting a force on the package to form a pressure connection therebetween.

In the second embodiment of the connector of the present invention, the base receptacle is adapted to receive a large scale integrated circuit package which has leads extending therefrom, and the connector is designed to exert a force on the package to form a pressure connection between the leads of the package and terminal pads on the backpanel.

In both embodiments, the force needed to form these pressure connections is provided by a demountable cover having a plurality of especially configured aperture means formed in substantially equally spaced increments adjacent the periphery thereof so that when the cover is placed atop the base receptacle, upstanding stud means provided on the base will be received in the special apertures and downward deflection of the cover to produce an evenly applied force vector on the integrated circuit package will result when the cover is slidingly moved relative to the base.

In both the first and second embodiments of the connector of the present invention a special endless sealing gasket is interposed between the cover and the integrated circuit package so that when the cover is deflected downwardly as described above, the gasket will sealingly form a liquid-tight chamber between the cover and the package. A liquid coolant is circulated through the liquid-tight chamber for heat dissipation purposes.

In a modified form of the connector, a sealed metallic tank structure is provided below the cover and liquid coolant is circulated through the tank to carry off the heat produced by the circuit package.

Accordingly, it is an object of the present invention to provide a new and useful connector for large scale integrated circuit packages.

Another object of the present invention is to provide a new and useful connector for large scale integrated circuit packages that may be configured to accommodate various sizes and shapes and types of such packages.

Another object of the present invention is to provide a new and useful connector for leadless integrated circuit packages that may be configured to be compatible with various types of backpanels.

Another object of the present invention is to provide a new and improved connector for large scale integrated circuit packages which produces an evenly distributed force on the package to form pressurized interconnection of the integrated circuit package with the backpanel.

Still another object of the present invention is to provide a new and useful connector of the above described character which is provided with means for circulating a liquid coolant therethrough for dissipating heat produced by the large scale integrated circuit package mountable therein.

The foregoing and other objects of the present invention as well as the invention itself, may be more fully understood from the following description when read in conjunction with the accompanying drawings.

BRIEF DESCRIPTION OF THE DRAWINGS

FIG. 2 is a plan view of the connector of FIG. 1 which is partially broken away to illustrate the various features thereof.

FIG. 3 is an enlarged sectional view taken along the line 3—3 of FIG. 2.

FIG. 4 is a bottom view of the cover of the preferred connector of the present invention.

FIG. 5 is an enlarged fragmentary sectional view taken along the line 5—5 of FIG. 2.

FIG. 6 is an enlarged fragmentary isometric view illustrating the preferred form of a typical one of the aperture means formed in the cover of the connector of the present invention.

FIG. 7 is a view similar to FIG. 6 and illustrates a modified form of a typical one of the aperture means which may be formed in the cover of the connector of the present invention.

FIG. 8 is an enlarged fragmentary sectional view which illustrates another modified form of a typical one of the aperture means which may be formed in the cover of the connector of the present invention.

FIG. 9 is a sectional view similar to FIG. 3 and illustrating a modification of the connector of the present invention.

FIG. 10 is a plan view of the coolant tank employed in the modified connector of FIG. 9.

FIG. 11 is an enlarged fragmentary sectional view taken along the line 11—11 of FIG. 10.

Figure 1:
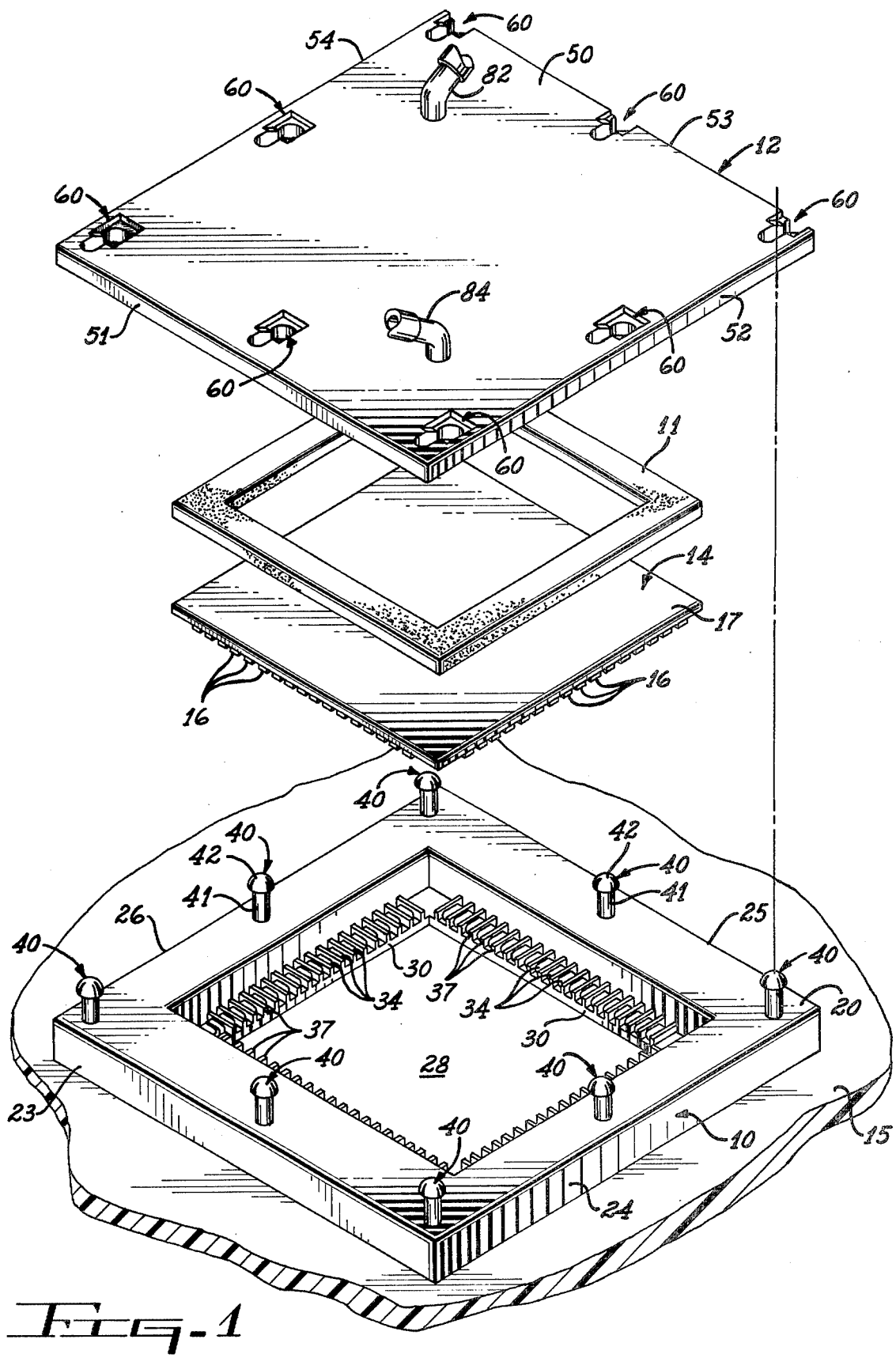
FIG. 1 is an exploded isometric view of the preferred embodiment of the connector of the present invention illustrating the various features thereof.

in which the cover assembly 12 is mounted to the base assembly 10.

Toward this end, a plurality of upstanding stud means 40 are mounted, as will hereinafter be described, in the housing 20 of the base assembly 10. The studs 40 extend normally from the side walls 23-26 of the housing 20 and are arranged in substantially equally spaced increments about the chamber 28 thereof. In the preferred embodiment, the studs 40 are eight in number with different ones of those studs being located at each corner of the housing and intermediate the ends of each side wall 23-26 of the housing.

Each of the stud means 40 is provided with a shank 41 (FIG. 3) having an enlarged head 42 on the upper end, and the studs may be affixed to the housing in any suitable manner such as by being molded therein. If such a method of affixation is employed, the studs 40 may be provided with annular protrusions 43 (FIG. 3) on the shank 41 which serve as anchors to prevent the studs from being pulled out of the housing. An alternate form of stud and mounting means could be employed such as providing threads (not shown) on the shank for threaded engagement with captive nuts (not shown) suitably carried in the housing.

In any case, the stud means 40 are each configured to provide a downwardly facing shoulder on the enlarged head 42, with those shoulders serving as cover deflecting and retaining means as will hereinafter be described in detail.

The cover 12 comprises a body 50 which is a planar structure configured to mount atop the base assembly 10 and thus may be formed in a geometric shape and size which substantially matches that of the base housing 20, with the exception of the thickness dimension. In the illustrated embodiment, the cover body 50 is a substantially square structure having side edges 51, 52, 53 and 54, and having an upper planar surface 56 and a lower planar surface 57.

A plurality of aperture means 60 are formed in the cover 50 with there being one of those aperture means for each of the stud means 40 of the base housing 20. Thus, in the preferred embodiment the aperture means 60 are eight in number with different ones thereof being located at each corner of the cover 12 and midway between the ends of each side edge 51–54 of the cover.

In the preferred embodiment of the present invention, each of the aperture means 60 includes a special surface configuration formed in the cover body 50 which, as seen best in FIG. 6, comprises a lower surface 62, an upper surface 63 which is laterally spaced from the lower surface, and an inclined plane surface 64 or ramp which extends between the lower surface 62 and the upper surface 63. As seen, the lower surface 62 is provided by forming a cavity 65 which is recessed below the upper planar surface 56 of the cover 12, and that the upper surface 63 is actually a portion of the upper planar surface 56 of the cover body 50. Although that particular arrangement is preferred, FIG. 7 illustrates another method of accomplishing the same objective. In the modification shown in FIG. 7, the lower surface 62 of the aperture means 60a is actually a portion of the upper planar surface 56 of the cover body 50, and the upper surface 63 is provided by molding or otherwise forming a pedestal 68 on the cover body 50 with the upper surface 63 being the top of the pedestal, and the inclined plane surface 64 forming one side thereof.

In either case, each of the aperture means 60 or 60a further comprises a keyhole shaped aperture formed through the cover body with the aperture including an enlarged portion 70 and a laterally extending narrowed slot 72. The enlarged portions 70 of the keyhole apertures open upwardly onto the lower surface 62 and are sized to be somewhat larger than the heads 42 of the upstanding studs 40 so that when the cover 12 is placed atop the base housing 20, the upstanding studs 40 will each enter into an aligned one of those enlarged portions 70. The narrowed slots 72 of the keyhole apertures each open upwardly onto the inclined plane surface 64 and onto the upper surface 63, and each have a width dimension which is somewhat larger than the diameter of the shanks 41 of the stud means 40 to permit lateral sliding of the cover 12 relative to the base assembly 10 as will hereinafter be described in detail.

As seen in FIG. 2, the narrowed slots 72 of each of the keyhole apertures, all extend in the same direction, i.e., extend toward the side edge 51 of the cover body 50. Thus, when the cover 12 is placed atop the base assembly 10, the stud means 40 will enter into the aligned aperture means 60 by passing upwardly in the enlarged portion 70 as hereinbefore mentioned, and will locate the enlarged heads 42 of the studs above the lower surfaces 62 of the aperture means 60. In that state, the cover 12 will rest lightly on the resilient sealing gasket 11 and will be laterally offset with respect to the base 10, as shown in dotted lines 74 in FIG. 2. Lateral sliding movement of the cover 12 in the direction of the arrow 75 (FIG. 2) will move the keyhole apertures relative to the stud means 40 so that the narrowed slots 72 are moved into straddling positions relative to the shanks 41 of the studs 40. Such movement will bring the inclined plane surfaces 64 into wedged engagement with the downwardly facing shoulders of the studs 40, and thereby cause downward deflection of the cover 12. The downwardly directed force exerted by the cover 12 will be transferred through the resilient sealing gasket 11 to the circuit package 14 and will bring the terminal pads 16 thereof into pressurized conductive contact with the spring elements 35 of the conductive elements 34 formed in the base assembly 10. When the inclined plane surfaces 64 of the aperture means 60 have passed completely beneath the heads 42 of the studs 40, the shoulders will bear against the upper surface 63 and thus, the cover will be lockingly held in the downwardly deflected position.

It should be noted that the inclined plane surfaces 64 should be configured with a length to height ratio of at least three to one, and preferably five to one, to provide a mechanical advantage that is high enough to facilitate lateral sliding movement of the cover.

Reference is now made to FIG. 8 wherein a typical one of a third modified form of aperture means 76 is shown. In this embodiment, the aperture means 76 includes only the keyhole aperture which extends between the upper and lower surfaces 56 and 57, respectively, of the cover body 50, with the aperture including an enlarged portion 77 and an extending narrowed slot 78. When the cover 12 is configured with the aperture means 76, mounting thereof to the base assembly 10 is accomplished by placing the cover atop the base with the stud means 40 entering into the enlarged portions 77 of their respectively aligned ones of the aperture means 76. Then, the cover is depressed toward the base assembly 10, such as by hand, to compress the resilient sealing gasket 11, which causes the heads 42 of the studs to be disposed above the upper surface 56 of the cover. Then the cover is laterally moved, as hereinbefore described, FIG. 12 is an enlarged fragmentary sectional view similar to FIG. 3 and illustrating a second embodiment of the connector of the present invention with this second embodiment being adapted to handle an integrated circuit package having laterally extending leads.

Figure 13:
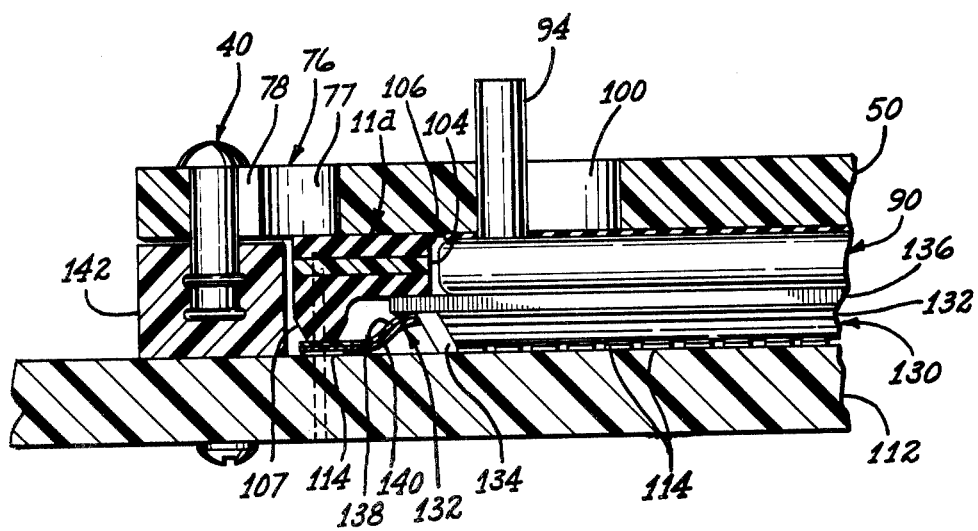

FIG. 13 is an enlarged fragmentary sectional view similar to FIG. 12 and illustrating another type of integrated circuit package mounted within the second embodiment of the connector of the present invention.

DESCRIPTION OF THE PREFERRED EMBODIMENTS

Referring more particularly to the drawings, FIG. 1 shows the preferred embodiment of the connector of the present invention as including a base assembly 10, a resilient sealing gasket 11, and a cover assembly 12 for mounting a leadless integrated circuit package 14 to a backpanel 15 as will hereinafter be described in detail.

The leadless integrated circuit package 14 is of the type sometimes referred to as a face mounted 2×2 substrate with that name denoting the manner in which the package is to be mounted as well as the physical size and geometric configuration thereof. This type of package 14 is of square configuration having a dimension of two inches per side, and has a plurality of terminal pads 16 on one surface of a planar substrate 17. The terminal pads 16 are positioned adjacent to at least one peripheral edge of the substrate 17 and are very often disposed adjacent all four peripheral edges thereof. Discreet integrated circuits (not shown) are mounted on the substrate 17 and are electrically interconnected with the terminal pads 16 in a well known manner. In most instances, the package 14 is provided with a sealed cover 18 (FIG. 3) for enclosing and protecting the discreet circuits (not shown).

It should be understood that the leadless integrated circuit package 14 is shown only for clarity and completeness of this disclosure and that other well known types of packages, such as DIP leadless packages (not shown) would have served this purpose equally as well. It should therefore be apparent that the geometric configuration of the connector of the present invention which is shown as being substantially square to accommodate the 2×2 substrate package 14, could just have easily been formed in a rectangular configuration to accommodate the usual rectangular shape of the DIP leadless packages (not shown).

As seen best in FIGS. 1 and 3, the base assembly 10 includes a housing 20 formed of a suitable dielectric material such as polycarbonate, polypropylene and the like. As will become apparent as this description progresses, relatively large forces will exist when the pressurized electrical interconnections are made within the connector of the present invention, and therefore, it is recommended that the material of which the housing 20 is fabricated be reinforced such as with glass fibers.

The housing 20 is shown as being of square ring configuration with upstanding side walls 23, 24, 25 and 26 which form an endless structure which defines the perimeter of an open chamber 28 (FIG. 1). The housing 20 further includes an endless ledge 30 which projects inwardly into the open chamber 28 from the lowermost edge of each of the upstanding walls 23, 24, 25 and 26 of the housing 20.

The base assembly 10 also includes means for electrically interconnecting the leadless package 14 with the wiring board or backpanel 15. In this embodiment of the present invention, the electrical interconnecting means is shown to include a plurality of conductive elements 34 which are embedded in the ledge 30 of the housing 20, and each of which is formed with a spring contact portion 35 extending upwardly from the ledge 30 into the chamber 28 of the housing 20, and a pin portion 36 depending from the ledge 30 of the housing 30. The conductive elements 34 are formed of a suitable electrically conductive material such as phosphor bronze, beryllium copper, and the like, and may be of one piece construction and may by fabricated by suitably affixing the spring contact portions 35 to the pin portions 36.

The conductive elements 34 are separated from each other by partitions 37 formed to extend upwardly from the ledge 30, and the elements 34 are arranged so as to match the spacing and layout of the terminal pads 16 of the leadless integrated circuit package 14 so that when the package is placed within the chamber 28 of the housing 20 the terminal pads will be in vertical alignment with the spring contact portions 35 of the conductive elements. Therefore, to accommodate the leadless package 14 when that package has the terminal pad 16 thereof aligningly arranged adjacent each of the peripheral edges of its substrate, the conductive element would be similarly aligningly arranged within the chamber 28 of the housing 20 adjacent each of the upstanding side walls 23–26 thereof. Likewise, if the package 14 has the terminal pads 16 thereof aligningly arranged adjacent to less than all of the peripheral edges of the substrate 17, the housing 20 need only be provided with a corresponding aligned arrangement of conductive elements 34. It should be apparent that the conductive elements 34 could be arranged within the chamber 28 of the housing 20 to accommodate virtually any array of terminal pads 16 provided on the substrate 17 of the leadless package 14, such as plural parallel rows of terminal pads (not shown), staggered terminal pads (not shown), and the like.

The spring contact portions 35 of the conductive elements 34 are formed into substantially loop shaped members which are vertically compressible and will exert a counteracting force when attempts are made at such vertical compression. In this manner, when the terminal pads 16 are pressed downwardly, as will hereinafter be described in detail, a gastight conductive contact is formed between terminal pads 16 and the aligned spring contact portions 35 of the conductive elements 34.

The pin portions 36 of the conductive elements 34 are in the form of the well known wire wrap pin, and as shown in FIG. 3, may be assembled to the backpanel 15 so as to protrude therethrough and thus expose the extending ends thereof for wire wrapping purposes as is well known in the art. Attachment of the pin portions 36 to the backpanel 15 may be accomplished in the well known manner of providing an interference fit within suitable pin apertures formed in the backpanel. Alternately, the pin portions 36 may be solder connected to the backpanel 15 (not shown) which is another well known technique. In either event, affixing the pin portions 36 to the backpanel or wiring panel 15 will also serve to mount the base assembly 10 thereto.

As hereinbefore mentioned, electrical interconnection of the terminal pads 16 of the package 14 with the spring contact portions 35 of the conductive elements 34 is made by a pressure connection. In the connector of the present invention, the force necessary to achieve such a pressure connection is derived from the manner so that the narrowed slots 78 will move to a position where they straddle the shanks 41 of their respective studs. When the lateral movement of the cover 12 is complete, the cover is released and the resilient sealing gasket 11 will move the cover away from the base assembly 10 thus bringing the upper surface 56 of the cover into engagement with the shoulders of the stud means 40. It is to be understood that the resilient sealing gasket 11 in its normal, or uncompressed, state (not shown) will extend relatively far from the open chamber 28 of the body assembly 10 so that when the cover 12 is mounted thereon as shown in FIG. 12, the sealing gasket will still be compressed and will thus exert an upwardly directed force on the cover 12 so that the cover will be biased into engagement with the shoulders of the studs 40.

As is well known in the art, integrated circuit packages generate a considerable amount of heat when operating, and this heat is a problem which can destroy the packages and it is particularly acute with regard to large circuit packages such as the integrated circuit package 14.

Thus, as will now be described, the connector of the present invention is provided with means for cooling of the circuit package 14. As seen best in FIGS. 2 and 3, the resilient sealing gasket 11 is of square ring endless configuration, and is disposed so as to engage the upwardly facing surface of the substrate 17 adjacent the periphery thereof. When the cover assembly 12 is mounted on the base assembly 10, as previously described, the resilient gasket 11 will transfer the downwardly directed forces exerted by the cover to the circuit package 14 which, in addition to loading the terminal pads 16 of the package 14 into conductive contact with the conductive elements 34 of the base 10, will form a liquid-tight seal between the gasket 11 and the substrate 17 and between the gasket and lower surface 57 of the cover body 50.

Therefore, the area within the confines of the gasket 11 forms a sealed liquid-tight chamber 80 having its sides defined by the gasket 11, its bottom defined by the substrate 17, and its top defined by the lower surface 57 of the cover 12.

A fluid inlet pipe 82 and a fluid outlet pipe 84 are mounted in the cover assembly 12 so as to extend through the cover and are located adjacent diagonally opposed corners thereof. A liquid coolant (not shown) such as water, an inert refrigerant, or the like, is supplied under pressure through the inlet pipe 82 into the cooling compartment 80, from a suitable remotely located source (not shown), and that coolant will flow over the upper surface of the substrate 17 and will exit the compartment 80 through the outlet pipe 84. The coolant, which absorbs the heat produced by the circuit package 14, may then be directed through a suitable remotely located heat exchanger (not shown) and recirculated.

To insure efficient heat transfer between the substrate 17 and the coolant which is passable through the cooling compartment 80, flow directing means are provided so that the coolant will follow a tortuous path in its flow from the inlet pipe 82 to the outlet pipe 84. The flow directing means can be a separate element (not shown) however, for simplicity and convenience of assembly, it is preferred that it be molded or otherwise formed as an integral part of the cover assembly 12. Therefore, the preferred form of flow directing means includes an especially configured array of walls or partitions 86 which depend normally from the lower surface 57 of the cover body 50 so that when the cover is mounted on the body assembly 10, the partitions 86 extend from the cover body 50 into the cooling compartment 80. The partitions 86 can be arranged in various arrays such as to form the back and forth tortuous path for the coolant shown in FIGS. 2 and 4, or alternately in a manner which would form a spiral path (not shown) leading to a centrally located outlet (not shown).

Reference is now made to FIGS. 9, 10 and 11 wherein a modified structure for cooling of the circuit package 14 is shown as further including a tank 90 of hollow substantially planar configuration which is located in the chamber 80 by being interposed between the cover body 50 and the integrated circuit package 14. The tank 90 is of substantially square shape so as to fit within the sealed chamber 80 provided within confines of the resilient gasket 11, and the tank has an inlet pipe 92 and an outlet pipe 94 which extend upwardly from diagonally opposed corners thereof. The inlet and outlet pipes 92 and 94, respectively, will conduct coolant into and out of the tank in a manner similar to that previously described. As shown in FIG. 11, the top 95 and integral side walls 96 of the tank 90 are formed of a relatively heavy gage metal, and the bottom 98 is of relatively thin gage metal which is soldered or otherwise sealingly affixed to the lower edges of the side walls 96. The tank 90 is preferably provided with a suitably disposed array of baffles or partitions 99 within the tank so that the coolant (not shown) which is movable therethrough will follow a tortuous flow path for efficient heat transfer purposes. The baffles 99 may be arranged in any suitable array and may be attached, such as by soldering, to the side walls 96 and/or the top 95 of the tank 90. However, it is preferred that the baffles not be secured to the bottom 98 of the tank 90. As a result of the bottom 98 being of thin gage material, and being retained only at the peripheral edges thereof, it will act as a deflectably movable diaphragm or membrane that will move into contiguous engagement with the upwardly disposed surface of the substrate 17 when coolant under pressure is moved through the tank 90.

As shown in FIG. 9, assembly of the connector of the present invention, when equipped with the cooling tank 90, is accomplished by placing the tank 90 atop the substrate 17 of the circuit package 14 so that the inlet and outlet pipes 92 and 94, respectively, extend upwardly therefrom. The cover body 50 is provided with a pair of slots 100 formed therethrough, so that when the cover is placed on the base assembly 10, the inlet and outlet pipes will extend through the slots 100. The slots are elongated so that the cover 12 may be laterally moved for mounting purposes as hereinbefore described.

The gasket 11 may be fabricated in any suitable manner such as by molding a suitable elastomeric material around a rigid core 102 as shown in FIGS. 3, 5 and 9, or as shown in FIGS. 12 and 13 by forming the gasket 11a as a laminated structure having a relatively rigid center ply 104 interposed between plys 106 and 107 of elastomeric materials. Forming the gasket with the rigid core 102 or with the relatively rigid center ply 104, will maintain the ring shaped configuration of the gasket, and thus prevent displacement thereof which could cause coolant leakage when the connector of the present invention is equipped with the previously described cooling compartment 80.

Reference is now made to FIG. 12 wherein a second embodiment of the connector of the present invention is shown for electrically interconnecting an integrated circuit package 110 of the type having leads 111, to a backpanel which is in the form of a printed circuit board 112 having the usual mounting pads 114 thereon. The integrated circuit package 110 is essentially the same as the previously described circuit package 14 except that the circuit package 110 is provided with the extending leads 111 rather than surface mounted terminal pads as was the case with the circuit package 14.

Each of the plurality of leads 111 extend from the circuit package 110 and are formed into a depending loop configuration to provide a spring contact portion 116. Each of the spring contact portions 116 is pressurized into conductive contact with a different mounting pad 114 on the printed circuit board 112 by the downwardly applied force exerted by the cover assembly 12 and transferred to the substrate 17 of the circuit package 110 by the resilient sealing gasket 11 as previously described.

To accommodate this particular type of circuit package and mounting technique, this modified form of the connector of the present invention employs a base assembly 118 which is essentially the same as the previously described base assembly 10 except that the ledge 30 of the base 10 is not needed in the base 118. Thus, the base assembly 118 is formed with a central opening 119 and only the partitions 120 extend into that opening, and those partitions serve as separators for the individual leads 111 of the circuit package 110, and serve as stops to prevent excessive downwardly applied force from damaging the leads.

Although the second embodiment of the connector of the present invention is shown in FIG. 12 as being provided with the sealed liquid-tight chamber 80, it is to be understood that this form of the connector could be provided with the coolant tank 90 as previously described.

Reference is now made to FIG. 13 wherein still another embodiment of the connector of the present invention is shown for electrically interconnecting an integrated circuit package 130 to the backpanel in the form of the previously described printed circuit board 112. This particular type of circuit package 130 is provided with a stripline terminal 132 extending laterally through the cover 134 and beyond the edges of the substrate 136. The strip-line terminals 132 are formed of an elongated flexible strip of insulative material 138 having metallic leads 140 printed or otherwise affixed thereto.

To accommodate this particular type of circuit package 130, the base assembly 142 of this embodiment of the connector of the present invention is essentially the same as the above described base assembly 118 except that the partitions 120 of the base assembly 118 are not needed in the base assembly 142.

Although this third embodiment of the connector of the present invention is illustrated in FIG. 13 as having the coolant tank 90 mounted therein, it will be understood that the cooling function can be accomplished by employing the previously described sealed cooling chamber 80.

While the principles of the invention have now been made clear in an illustrated embodiment, there will be immediately obvious to those skilled in the art, many modifications of structure, arrangements, proportions, the elements, materials, and components used in the practice of the invention, and otherwise, which are particularly adapted for specific environments and operation requirements without departing from those principles. The appended claims are therefore intended to cover and embrace any such modifications within the limits only of the true spirit and scope of the invention.

What I claim is:

1. A liquid cooled connector for removably mounting a leadless circuit package onto a backpanel and electrically coupling the terminal pads of the leadless circuit package to the backpanel, said connector comprising:
   (a) a housing mountable on the backpanel and having endless upstanding side walls which form the perimeter of an upwardly opening chamber into which the circuit package is nestingly positionable;
   (b) electrical interconnecting means in said housing and extending into the chamber thereof for engaging the terminal pads of the leadless circuit package when that package is positioned therein and extending from said housing for engaging the backpanel when said housing is mounted thereon;
   (c) a plurality of stud means mounted on said housing in substantially evenly spaced increments so as to be upstanding from each of the side walls thereof in an array which surrounds the chamber of said housing;
   (d) a resilient gasket positionable in the chamber of said housing on top of the circuit package when that package is positioned therein, said gasket disposed to extend above the side walls of said housing;
   (e) a cover positionable above said housing in overlaying relationship with respect to the side walls thereof and in engagement with the extending portion of said gasket when said gasket and the circuit package are positioned in said housing, said cover being laterally and downwardly movable relative to said housing for exerting a downwardly directed force on said gasket with said gasket transferring that force to the circuit package, said cover having a plurality of aperture means formed therein for receiving said stud means when said cover is positioned above said housing and for removably holding said cover in the laterally and downwardly moved position thereof;
   (f) said gasket of endless ring shaped configuration to form a sealed chamber within the confines thereof with the bottom of said sealed chamber being formed by the circuit package when the package is positioned in said housing and the top of said sealed chamber being formed by said cover; and
   (g) means in said cover through which liquid coolant is circulatingly suppliable to said sealed chamber.

2. A liquid cooled connector as claimed in claim 1 and further comprising flow directing means in said sealed chamber provided within the confines of said gasket, said flow directing means forming a tortuous path of flow for the liquid coolant when that coolant is circulatingly supplied thereto.

3. A liquid cooled connector as claimed in claim 2 wherein said flow directing means comprises a plurality of partitions integrally formed on said cover and depending therefrom.

4. A liquid cooled connector as claimed in claim 1 and further comprising a hollow tank of substantially planar configuration, said tank disposed within said sealed chamber provided within the confines of said gasket and adapted to handle the liquid coolant when that coolant is circulatingly supplied thereto.

5. A liquid cooled connector as claimed in claim 4 wherein said hollow tank is provided with flow directing means therein for forming a tortuous flow path for the liquid coolant when that coolant is handled thereby.

6. A liquid cooled connector as claimed in claim 4 wherein said hollow tank comprises:
   (a) a metallic top of planar configuration;
   (b) metallic side walls integral with said top and endlessly depending from the perimeter thereof;
   (c) a bottom of planar configuration and of relatively thin gage metal, said bottom having its perimeter sealingly affixed to the depending edges of said side walls;
   (d) a plurality of partitions dependingly affixed to said top and arranged in an array to provide a tortuous flow path for the liquid coolant when that coolant is handled by said tank; and
   (e) said means through which the liquid coolant is circulatingly supplyable including an inlet pipe and an outlet pipe extending upwardly from said top through said cover.

7. A liquid cooled connector as claimed in claim 1 wherein said plurality of aperture means formed in said cover each comprise:
   (a) a lower surface formed on said cover;
   an upper surface formed on said cover and laterally spaced from said lower surface;
   (c) an inclined plane surface extending angularly between said lower surface and said upper surface; and
   (d) said cover having a keyhole shaped aperture formed therethrough, said aperture having an enlarged portion which opens upwardly onto said lower surface and having a narrowed slot which opens upwardly onto said inclined plane surface and onto said upper surface.

8. A liquid cooled connector as claimed in claim 1 wherein said plurality of aperture means formed in said cover each comprise:
   (a) a lower surface forming the bottom of a recessed cavity provided in the upper planar surface of said cover;
   (b) an inclined plane surface formed in said cover so as to extend laterally angularly and upwardly from said lower surface to the upper planar surface of said cover; and
   (c) said cover having a keyhole shaped aperture formed therethrough, said aperture having an enlarged portion which opens upwardly onto said lower surface and having a narrowed slot which opens upwardly onto said inclined plane surface and onto the upper planar surface of said cover.

9. A liquid cooled connector as claimed in claim 1 wherein said plurality of aperture means formed in said cover each comprises:
   (a) an upstanding pedestal formed on said cover and having an upper surface;
   (b) an inclined plane surface forming one side of said pedestal, said inclined plane surface extending laterally angularly and downwardly from the upper surface of said pedestal to the upper planar surface of said cover; and
   (c) said cover having a keyhole shaped aperture formed therethrough, said aperture having an enlarged portion which opens upwardly onto the upper planar surface of said cover adjacent said inclined plane surface and having a narrowed slot which opens upwardly onto said inclined plane surface and onto the upper surface of said pedestal.

10. A liquid cooled connector as claimed in claim 1 wherein each of said plurality of stud means comprises:
    (a) a shank portion affixed to said housing and upstanding therefrom; and
    (b) an enlarged head on the upwardly extending end of said shank.

11. A liquid cooled connector as claimed in claim 1 and further comprising:
    (a) each of said plurality of stud means including,
       I. a shank affixed to said housing and upstanding therefrom,
       II. an enlarged head on the upwardly extending end of said shank; and
    (b) each of said plurality of aperture means formed in said cover being of keyhole shaped configuration and extending between the upper and lower planar surfaces thereof, said keyhole shaped aperture having an enlarged portion for receiving one of said plurality of stud means when said cover is positioned above said housing and having a narrowed slot which straddles said shank below said enlarged head when said cover is in the laterally and downwardly disposed position thereof.

12. A liquid cooled connector for removably mounting an integrated circuit package having laterally extending conductive leads onto a backpanel and electrically coupling the conductive leads to the terminal pads provided on the backpanel, said connector comprising:
    (a) a housing for mounting on the backpanel and having endless upstanding side walls which form the perimeter of an open chamber into which the circuit package is nestingly positionable with the conductive leads thereof in aligned engagement with the terminal pads of the backpanel;
    (b) a plurality of stud means mounted on said housing in substantially evenly spaced increments so as to be upstanding from each of the side walls in an array which surrounds the open chamber of said housing;
    (c) a resilient gasket positionable in the chamber of said housing so as to rest on the circuit package and the conductive leads thereof when that package is positioned therein, said gasket disposed to extend above the sidewalls of said housing;
    (d) a cover positionable above said housing in overlaying relationship with respect to the side walls thereof and in engagement with the extending portion of said gasket when said gasket and the circuit package are positioned in said housing, said cover being laterally and downwardly movable relative to said housing for exerting a downwardly directed force on said gasket which transfers that force to the circuit package and to the conductive leads thereof, said cover having a plurality of aperture means formed therein for receiving said stud means when said cover is positioned above said housing and for removably holding said cover in the laterally and downwardly moved position thereof;
    (e) said gasket of endless ring shaped configuration to form a sealed chamber within the confines thereof with the bottom of said sealed chamber being formed by the circuit package when the package is positioned in said housing and the top of said sealed chamber being formed by said cover; and (f) means in said cover through which liquid coolant is circulatingly suppliable to said sealed chamber.

13. A liquid cooled connector as claimed in claim 12 and further comprising flow directing means in said sealed chamber provided within the confines of said gasket, said flow directing means forming a tortuous path of flow for the liquid coolant when that coolant is circulatingly supplied thereto.

14. A liquid coolant connector as claimed in claim 13 wherein said flow directing means comprises a plurality of partitions integrally formed on said cover and depending therefrom.

15. A liquid cooled connector as claimed in claim 12 and further comprising a hollow tank of substantially planar configuration, said tank disposed within said sealed chamber provided within the confines of said gasket and adapted to handle the liquid coolant when that coolant is circulatingly supplied thereto.

16. A liquid cooled connector as claimed in claim 15 wherein said hollow tank is provided with flow directing means therein for forming a tortuous flow path for the liquid coolant when that coolant is handled thereby.

17. A liquid cooled connector as claimed in claim 15 wherein said hollow tank comprises:
  (a) a metallic top of planar configuration;
  (b) metallic side walls integral with said top and endlessly depending from the perimeter thereof;
  (c) a bottom of planar configuration and of relatively thin gage metal, said bottom having its perimeter sealingly affixed to the depending edges of said side walls;
  (d) a plurality of partitions dependingly affixed to said top and arranged in an array to provide a tortuous flow path for the liquid coolant when that coolant is handled by said tank; and
  (e) said means through which the liquid coolant is circulatingly suppliable including an inlet pipe and an outlet pipe extending upwardly from said top through said cover.

18. A liquid cooled connector as claimed in claim 12 wherein said plurality of aperture means formed in said cover each comprise:
  (a) a lower surface formed on said cover;
  (b) an upper surface formed on said cover and laterally spaced from said lower surface;
  (c) an inclined plane surface extending angularly between said lower surface and said upper surface; and
  (d) said cover having a keyhole shaped aperture formed therethrough, said aperture having an enlarged portion which opens upwardly onto said lower surface and having a narrowed slot which opens upwardly onto said inclined plane surface and onto said upper surface.

19. A liquid cooled connector as claimed in claim 12 wherein said plurality of aperture means formed in said cover each comprise:
  (a) a lower surface forming the bottom of a recessed cavity provided in the upper planar surface of said cover;
  (b) an inclined plane surface formed in said cover so as to extend laterally angularly and upwardly from said lower surface to the upper planar surface of said cover; and
  (c) said cover having a keyhole shaped aperture formed therethrough, said aperture having an enlarged portion which opens upwardly onto said lower surface and having a narrowed slot which opens upwardly onto said inclined plane surface and onto the upper planar surface of said cover.

20. A liquid cooled connector as claimed in claim 12 wherein said plurality of aperture means formed in said cover each comprises:
  (a) an upstanding pedestal formed on said cover and having an upper surface;
  (b) an inclined plane surface forming one side of said pedestal, said inclined plane surface extending laterally angularly and downwardly from the upper surface of said pedestal to the upper planar surface of said cover; and
  (c) said cover having a keyhole shaped aperture formed therethrough, said aperture having an enlarged portion which opens upwardly onto the upper planar surface of said cover adjacent said inclined plane surface and having a narrowed slot which opens upwardly onto said inclined plane surface and onto the upper surface of said pedestal.

21. A liquid cooled connector as claimed in claim 12 wherein each of said plurality of stud means comprises:
  (a) a shank portion affixed to said housing and upstanding therefrom; and
  (b) an enlarged head on the upwardly extending end of said shank.

22. A liquid cooled connector as claimed in claim 12 and further comprising:
  (a) each of said plurality of stud means including,
    I. a shank affixed to said housing and upstanding therefrom,
    II. an enlarged head on the upwardly extending end of said shank; and
  (b) each of said plurality of aperture means formed in said cover being of keyhole shaped configuration and extending between the upper and lower planar surfaces thereof, said keyhole shaped aperture having an enlarged portion for receiving one of said plurality of stud means when said cover is positioned above said housing and having a narrowed slot which straddles said shank below said enlarged head when said cover is in the laterally and downwardly disposed position thereof.

* * * * *